(12) United States Patent
Nishihara et al.

(10) Patent No.: US 7,184,304 B2
(45) Date of Patent: Feb. 27, 2007

(54) NONVOLATILE SEMICONDUCTOR MEMORY DEVICE AND METHOD FOR FABRICATING THE SAME

(75) Inventors: Ryuji Nishihara, Osaka (JP); Masashi Agata, Osaka (JP); Toshiaki Kawasaki, Osaka (JP); Masanori Shirahama, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 32 days.

(21) Appl. No.: 11/191,963

(22) Filed: Jul. 29, 2005

(65) Prior Publication Data

US 2006/0023538 A1 Feb. 2, 2006

(30) Foreign Application Priority Data

Aug. 2, 2004 (JP) ............................. 2004-225081

(51) Int. Cl.
*G11C 16/04* (2006.01)
(52) U.S. Cl. ............................. 365/185.03; 365/189.12

(58) Field of Classification Search ........... 365/185.03, 365/189.12, 190
See application file for complete search history.

(56) References Cited

U.S. PATENT DOCUMENTS 6,633,499 B1*  10/2003  Eitan et al. ............. 365/185.16
7,050,347 B2*   5/2006  Nishihara et al. ........... 365/207

FOREIGN PATENT DOCUMENTS

JP          03-120759        5/1991

* cited by examiner

*Primary Examiner*—Vu A. Le
(74) *Attorney, Agent, or Firm*—McDermott Will & Emery LLP

(57) ABSTRACT

A semiconductor memory device includes: first and second bit cells for storing complementary data; a scan circuit for outputting a selected data signal; a bit-cell selector receiving the output of the scan circuit and selecting one of the bit cells; and a data write controlling circuit for controlling data writing. Write paths for all the bit cells for storing "0" are not selected and data is written only in a bit cell for storing "1", so that write operation performed in steps is achieved.

9 Claims, 13 Drawing Sheets

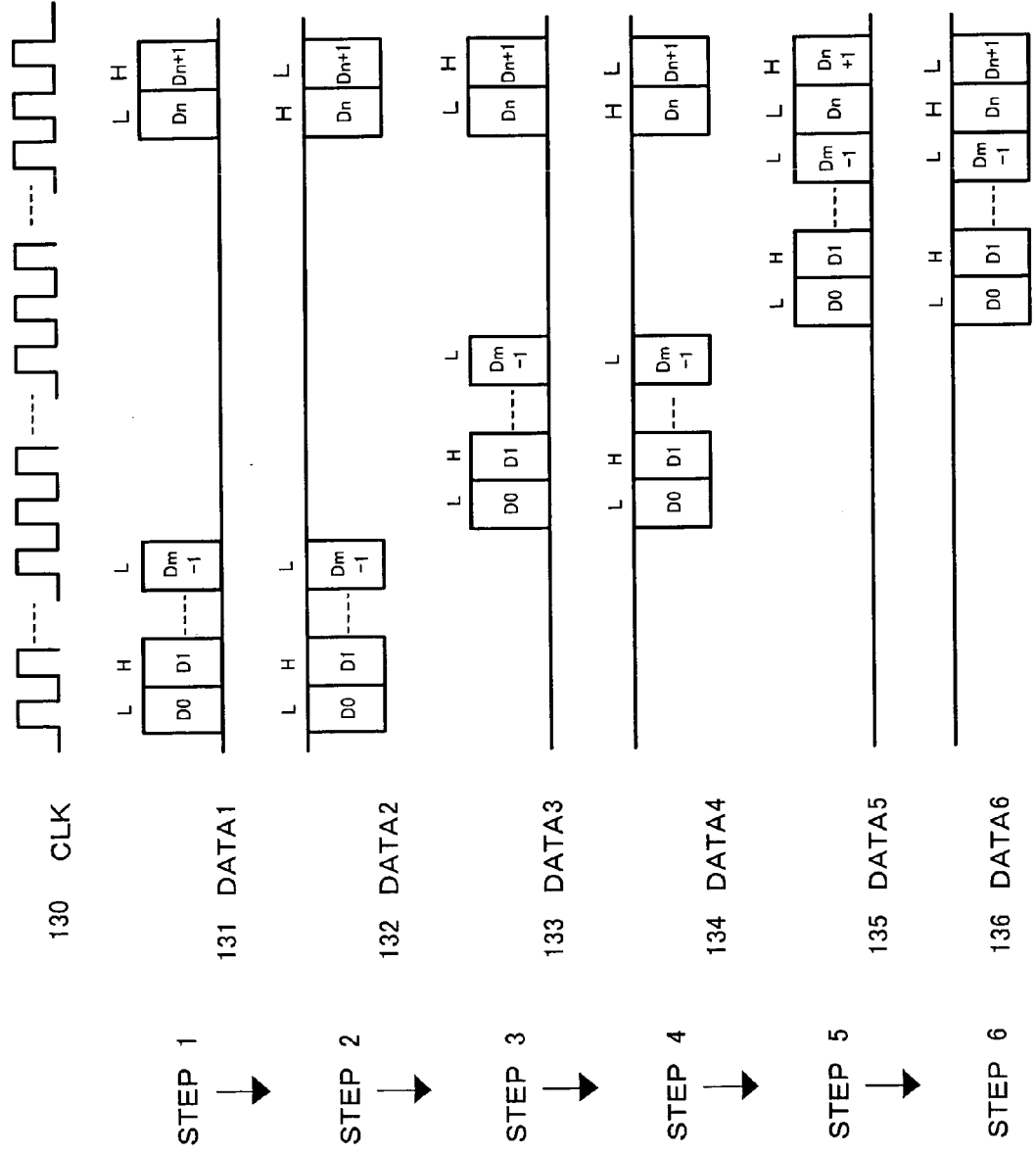

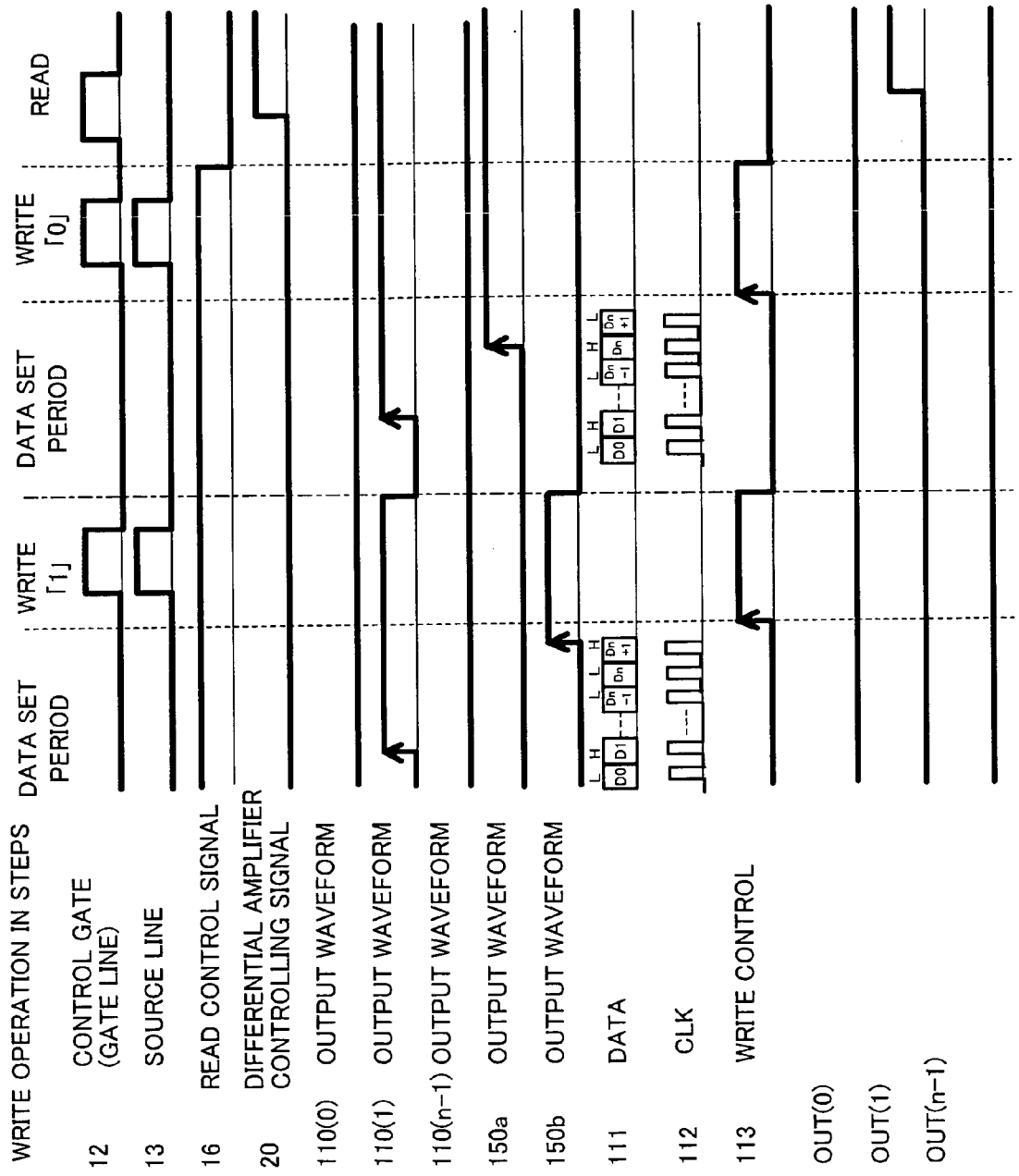

NONVOLATILE SEMICONDUCTOR MEMORY DEVICE AND METHOD FOR FABRICATING THE SAME

CROSS-REFERENCE TO RELATED APPLICATION

This application claims priority under 35 U.S.C. §119(a) on Patent Application No. 2004-225081 filed in Japan on Aug. 2, 2004, the entire contents of which are hereby incorporated by reference.

BACKGROUND OF THE INVENTION (1) Field of the Invention

The present invention relates to nonvolatile semiconductor memory devices, and more specifically relates to write operation of a nonvolatile semiconductor memory device having two bit cells for storing opposite logic states.

(2) Description of the Related Art

With recent size reduction in fabrication processes, the thickness of transistor oxide films has been reduced. In conventional memory cells, this thickness reduction causes a problem in which leakage current or the like occurs in gate oxide films of MOS transistors to degrade data retention characteristics. With the process of determining data by comparing a voltage stored in a memory cell with a given threshold value, it has become more difficult to suppress reliability deterioration caused by the size reduction.

In view of this, a so-called differential cell formed by two bit cells and a differential amplifier has been already devised (see, for example, Japanese Unexamined Patent Publication No. 3-120759). In a nonvolatile semiconductor memory device of this type, in data write operation, data representing opposite logic states is accumulated in respective two bit cells according to the level of a threshold voltage, for example. Then, in read operation, the differential amplifier reads the potentials at the two bit cells, amplifies the potential difference and outputs the amplified difference as read-out data.

In a memory device using this differential cell, the influence of charge leakage from a memory cell is small and a large noise margin is secured, as compared to a memory device which determines data by comparing a voltage stored in a memory cell with a threshold value. That is, the use of the differential cells provides a nonvolatile semiconductor memory device having excellent data retention characteristics.

SUMMARY OF THE INVENTION

However, the conventional configuration has the following drawbacks.

In a differential cell, opposite logics are written in respective two bit cells in writing data. Specifically, data "1" is written in a first bit cell and data "0" is written in a second bit cell. In reading the written data, a differential amplifier detects the voltage difference between these bit cells and outputs the detection result. Accordingly, irrespective of whether data to be written is "0" or "1", write operation is always performed on one of the first and second bit cells. In a semiconductor memory device incorporating memory cells with large capacity, a large amount of current flows in a chip especially in write operation in which electrons are injected in a floating gate by channel hot electron injection for data storage. When a large amount of current flows in the chip at a time, this current amount exceeds the current ability of a writing device such as a tester for supplying write current, thus causing a problem in which writing is not performed accurately or estimation of write current is difficult.

It is therefore an object of the present invention to provide a semiconductor memory device in which the flow of current exceeding the ability of a writing device is prevented during operation.

Specifically, a nonvolatile semiconductor memory device according to the present invention includes: a plurality of pairs of first and second bit cells for storing data; a plurality of differential amplifiers each receiving, as complementary inputs, information from an associated one of the first bit cells and information from an associated one of the second bit cells and amplifying a difference between the inputs; and a bit-cell selector receiving the data and controlled to select one of the first and second bit cells according to an input signal.

With this configuration, it is possible to separately write data in a first bit cell and in a second bit cell, so that writing of "1" and writing of "0" are performed separately. As a result, the amount of current flowing in the entire chip in writing data is smaller than that in conventional devices. This makes it possible to operate the nonvolatile semiconductor memory device within the current ability of a writing device such as a tester.

A method for fabricating a nonvolatile semiconductor memory device according to the present invention is a method for fabricating a nonvolatile semiconductor memory device including a plurality of pairs of first and second bit cells for storing data, differential amplifiers each receiving, as complementary inputs, information from an associated one of the first bit cells and information from an associated one of the second bit cells and amplifying a difference between the inputs, a bit-cell selector receiving the data and controlled to select one of the first and second bit cells according to an input signal, and a plurality of shift registers connected in series, associated with the respective pairs of first and second bit cells and used for inputting the data to the bit-cell selector. The method includes the steps of: setting data to be written for one of the first and second bit cells associated with a bit having a fixed length predetermined according to the number of inputs of clock signals for controlling the shift registers, and setting data having a fixed value for the other bit cells associated with bits other than the fixed-length bit, thereby writing the data to be written in said one of the first and second bit cells; and shifting the fixed-length bit to a next fixed-length bit and writing the data to be written in another bit cell associated with the next fixed-length bit.

With this method, a nonvolatile semiconductor device for achieving control in which all the data is divided and write operation is performed only on a selected one of the first and second bit cells.

BRIEF DESCRIPTION OF THE DRAWINGS

FIG. 12 is a timing chart showing timings of data inputs in the semiconductor memory device of the fourth embodiment.

FIG. 13 is a timing diagram in normal write operation and read operation in the semiconductor memory device of the fourth embodiment.

DETAILED DESCRIPTION OF THE INVENTION

Hereinafter, embodiments of the present invention will be described with reference to the drawings.

Embodiment 1

Figure 1:
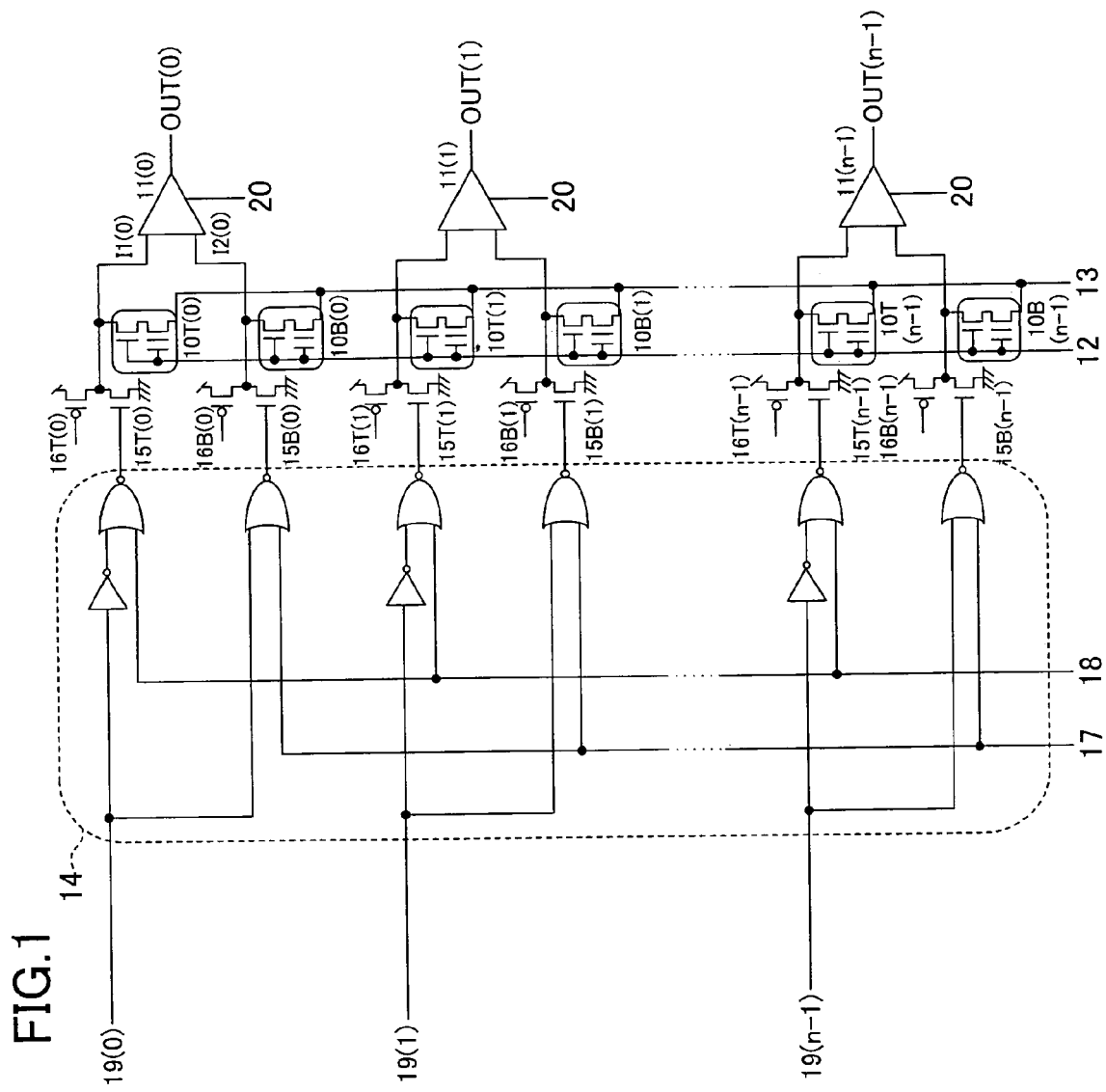
FIG. 1 is a circuit diagram illustrating a configuration of a semiconductor memory device according to a first embodiment of the present invention.
Figure 2:
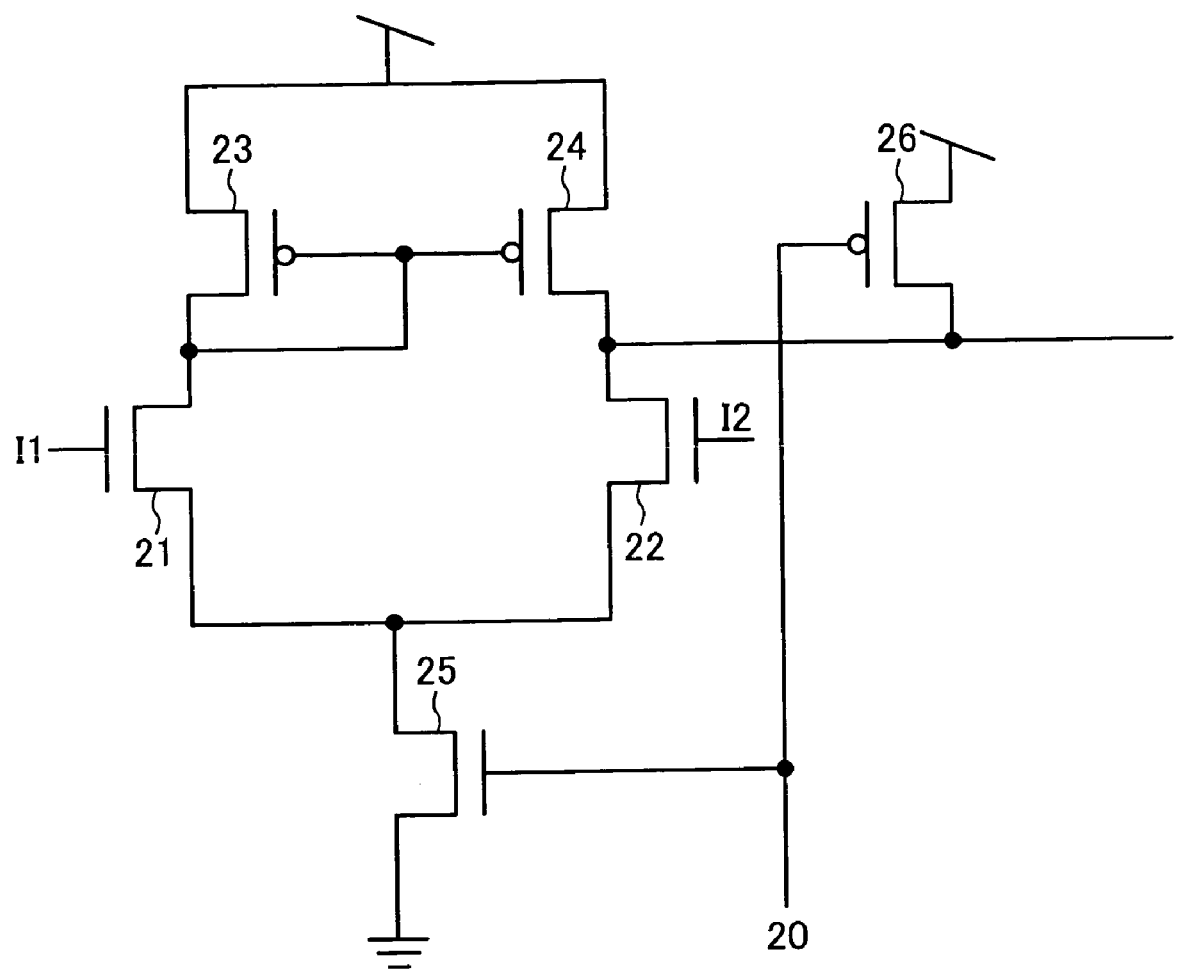
FIG. 2 is a circuit diagram illustrating a differential amplifier included in the semiconductor memory device illustrated in FIG. 1.
Figure 3:
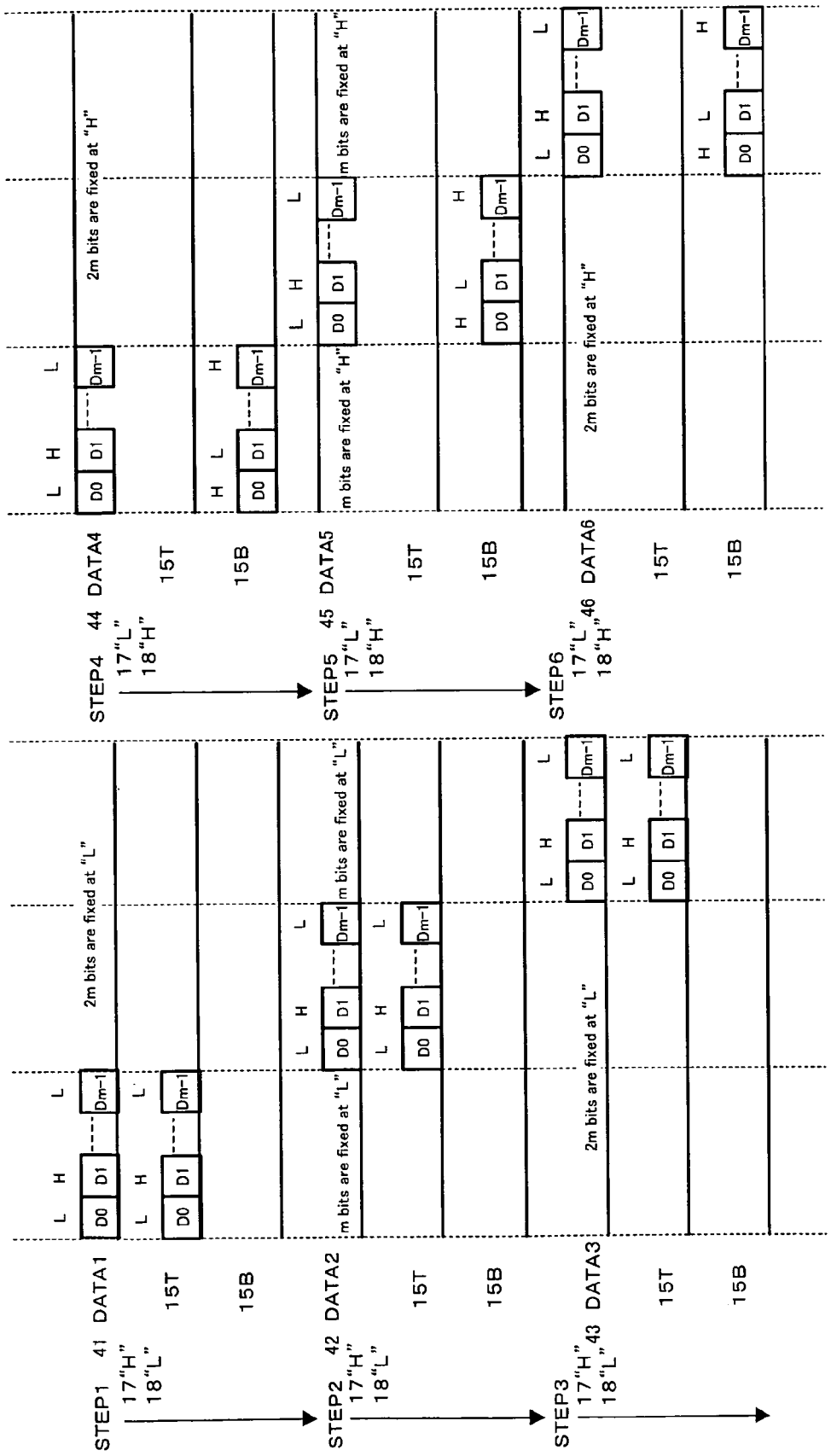
FIG. 3 is a timing chart showing timings of data inputs in the semiconductor memory device of the first embodiment.
Figure 4:
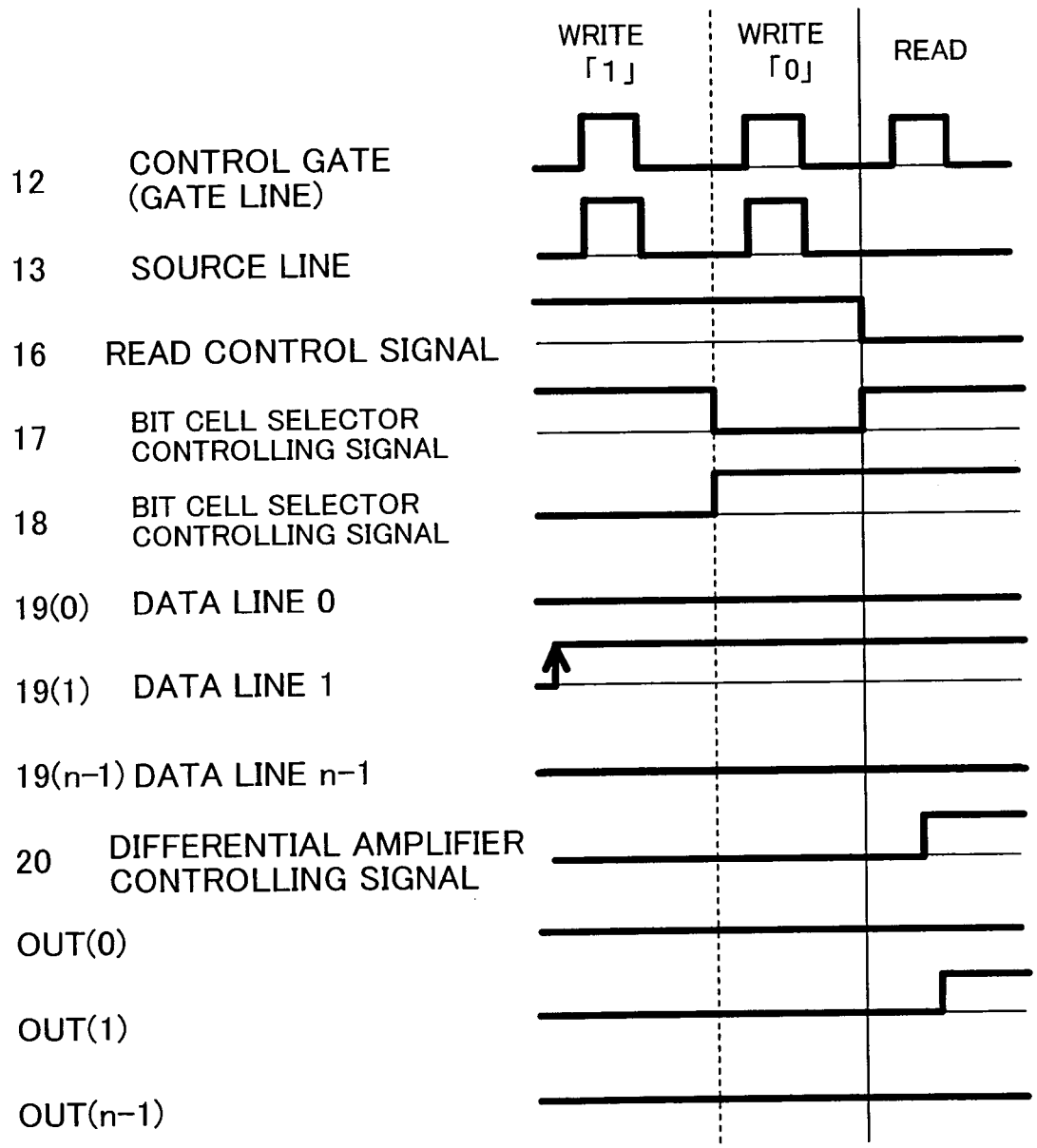
FIG. 4 is a timing chart showing signals during writing and reading each performed in separate steps and voltages applied to components in the semiconductor memory device of the first embodiment.

FIG. 1 is a circuit diagram illustrating a configuration of a semiconductor memory device according to a first embodiment of the present invention. FIG. 2 is a circuit diagram illustrating an internal configuration of a differential amplifier included in the semiconductor memory device illustrated in FIG. 1. FIG. 3 is a timing chart showing timings of data inputs in the semiconductor memory device of this embodiment. FIG. 4 is a timing chart showing signals during writing and reading each performed in separate steps and voltages applied to components in the semiconductor memory device of this embodiment.

As illustrated in FIG. 1, the semiconductor memory device of this embodiment includes: data lines 19(0) through 19(n−1) to which data is input; first bit cells 10T(0) through 10T(n−1) capable of holding binary data of "1" and "0"; second bit cells 10B(0) through 10B(n−1) each for holding data which is complementary to the data held in an associated one of the first bit cells 10T(0) through 10T(n−1); a bit-cell selector 14 connected to the data lines 19(0) through 19(n−1) and controlled according to input signals 17 and 18 to select one of the first bit cells 10T(0) through 10T(n−1) and the second bit cells 10B(0) through 10B(n−1); first switching transistors 15T(0) through 15T(n−1) receiving, at the gate electrodes, signals output from the bit-cell selector 14 and controlling writing of data in the first bit cells 10T(0) through 10T(n−1); second switching transistors 15B(0) through 15B(n−1) receiving, at the gate electrodes, signals output from the bit-cell selector 14 and controlling writing of data in the second bit cells 10B(0) through 10B(n−1); third switching transistors 16T(0) through 16T(n−1) controlling reading of data from the first bit cells 10T(0) through 10T(n−1); fourth switching transistors 16B(0) through 16B(n−1) controlling reading of data from the second bit cells 10B(0) through 10B(n−1); and differential amplifiers 11(0) through 11(n−1) amplifying the voltage differences between the first bit cells 10T(0) through 10T(n−1) and the second bit cells 10B(0) through 10B(n−1) and outputting the amplified differences in data read operation.

Whether or not data is written in a bit cell selected by the bit-cell selector 14 during write operation is determined by whether data input to the data line 19 is "0" or "1". Herein, n is an integer greater than zero. The first bit cells 10T(0) through 10T(n−1) and the second bit cells 10B(0) through 10B(n−1) have the same configuration including: a nonvolatile cell transistor having a control gate and a floating gate capable of storing charge; and an nMOSFET connected to the nonvolatile cell transistor. The control gates of the nonvolatile cell transistors and the gate electrodes of the nMOSFETs in the first bit cells 10T(0) through 10T(n−1) and the second bit cells 10B(0) through 10B(n−1) are connected to a common gate line 12. The nonvolatile cell transistors in the first bit cells 10T(0) through 10T(n−1) and the nonvolatile cells in the second bit cells 10B(0) through 10B(n−1) are connected to a common source line 13. Whether each of the differential amplifiers 11(0) through 11(n−1) is enabled or not is controlled in accordance with a control signal 20. In the semiconductor memory device of this embodiment, the first bit cells 10T(0) through 10T(n−1) and the second bit cells 10B(0) through 10B(n−1) are provided in a large number of pairs and are one- or two-dimensionally arranged, for example. The first bit cell 10T or the second bit cell 10B herein refers to any one of the first bit cells 10T(0) through 10T(n−1) or the second bit cells 10B(0) through 10B(n−1) in a case where it is unnecessary to distinguish the first bit cells 10T(0) through 10T(n−1) or the second bit cells 10B(0) through 10B(n−1) from each other, and the same holds for the other components.

As shown in FIG. 2, the main portion of the differential amplifier 11 includes: pMOSFETs 23 and 24 supplied with a power supply voltage and having their gate electrodes connected to each other; an nMOSFET 21 connected to the drain of the pMOSFET 23 and the gate electrodes of the pMOSFETs 23 and 24; and an nMOSFET 22 connected to the drain of the pMOSFET 24. The differential amplifier 11 further includes: an nMOSFET 25 having its drain connected to the source of the nMOSFET 21 and to the source of the nMOSFET 22 and having its source grounded; and a pMOSFET 26 having its drain connected to the drains of the pMOSFET 24 and the nMOSFET 22 and being supplied with a power supply voltage at its source. The gate electrodes of the nMOSFETs 21 and 22 serve as input parts of the differential amplifier 11. The gate electrode of the nMOSFET 25 and the gate electrode of the pMOSFET 26 are supplied with a control signal 20. When the control signal 20 is at a low level (hereinafter, referred as "L"), the nMOSFET 25 is OFF and the pMOSFET 26 is ON, so that the output of the differential amplifier 11 is fixed at a high level (hereinafter, referred to as "H"). On the other hand, when the control signal 20 is at "H", the nMOSFET 25 is ON and the pMOSFET 26 is OFF, so that the differential amplifier 11 is enabled. That is, the nMOSFET 25 functions as disabling means for disabling the differential amplifier 11. The pMOSFET 26 functions as output-fixing means for controlling a fixed current source for the differential amplifier 11. Instead of the pMOSFET 26, a MOS transistor may be provided between an output line and a ground line of the differential amplifier 11. In such a case, the output of the differential amplifier 11 is fixed at "L" by turning this MOS transistor ON.

FIG. 3 shows the case of adopting six steps with m bits (n=3 m) used as a unit, as an example in which data divided into bits is input to data line 19. In FIG. 3, a data series 41 contains divided data of m bits to be input to the data line 19 associated with the first bit cell 10T at STEP 1, a data series 42 contains divided data to be input to the data line 19 associated with the first bit cell 10T at STEP 2, a data series 43 contains divided data to be input to the data line 19 associated with the first bit cell 10T at STEP 3, a data series 44 contains divided data to be input to the data line 19 associated with the second bit cell 10B at STEP 4, a data series 45 contains divided data to be input to the data line 19 associated with the second bit cell 10B at STEP 5, and a data series 46 contains divided data to be input to the data line 19 associated with the second bit cell 10B at STEP 6.

Now, it will be described how the semiconductor memory device of this embodiment operates.

In writing data in memory cells incorporated in a chip, if writing is performed by using channel hot electron injection, a large amount of current flows in the chip. In this case, data cannot be written at a time in relation to current caused to flow by a writing device such as a tester. In view of this, the operation method of this embodiment adopts means for specifying bits to be written as a small number of bits having a fixed length and sequentially shifting the bits to be written. The fixed-length bits as a unit are determined in relation to the current ability of a writing device such as a tester. In general, as the current ability of a writing device becomes greater, the number of bits used as a unit can be increased accordingly. In this embodiment, as an example, the number of all bits associated with respective memory cells incorporated is n, data is input to all the bit cells in six steps, and m bits are written as a unit (n=3 m) at each step. In FIG. 3, it is assumed that data corresponding to D1 is "1" at each step. In STEPS 1 through 3, data is written in the first bit cell 10T. In STEPS 4 through 6, data is written in the second bit cell 10B.

First, at STEP 1 shown in FIG. 3, DATA1 included in the data series 41 and having an m bits is input to the data line 19 illustrated in FIG. 1. At this time, data other than the m-bit data to be input, i.e., 2 m bits, is "0", and the associated data lines 19 are fixed at "L". In this step, only DATA1 in this input data series 41 is written. Now, circuit operation when DATA1 is written will be described.

First, since write operation is being performed, the differential amplifiers 11(0) through 11(n−1) for use in read operation are controlled to be in non-operating states according to control signals 20.

Next, an input signal 17 for controlling the bit-cell selector 14 is set at "H" and an input signal 18 is set at "L". Then, the bit-cell selector 14 for selecting one of the first bit cells 10T(0) through 10T(n−1) and the second bit cells 10B(0) through 10B(n−1) turns OFF all the second switching transistors 15B(0) through 15B(n−1) for controlling writing of data in the second bit cells 10B(0) through 10B(n−1) (sets the gate potentials at "L") so that none of the second bit cells 10B(0) through 10B(n−1) is selected for writing. The third switching transistors 16T(0) through 16T(n−1) and the fourth switching transistors 16B(0) through 16B(n−1) are OFF throughout the write operation.

Then, data "1" is input the data line 19(1) out of the data lines 19(0) through 19(n−1) connected to the first bit cells 10T(0) through 10T(n−1) and the second bit cells 10B(0) through 10B(n−1) whereas data "0" is input the other data lines. At this time, only the first switching transistor 15T(1) for controlling writing of data in the first bit cell 10T(1) connected to the data line 19(1) through the bit-cell selector 14 is turned ON whereas the other first switching transistors 15T(0) through 15T(n−1) (where n=1, 3, 4, . . . ) are turned OFF. This state corresponds to the state immediately before the potentials at the control gate (the gate line 12) and the source line 13 rise in WRITE "1" (operation of writing "1") shown in FIG. 4.

In this state, a high voltage is applied to the gate line 12 and the source line 13 as shown in FIG. 4. Then, current flows only in the first bit cell 10T(1), and channel hot electrons are generated so that charge reaches the floating gate of the nonvolatile cell transistor. Accumulation of charge makes the threshold voltage of the nonvolatile cell transistor higher than that before the accumulation, and logic data "1" is stored. At this step, no current is generated and no write operation is performed in the bit cells except for the bit cell 10T(1). Thereafter, at STEPS 2 and 3, write operation similar to that in STEP 1 shown in FIG. 3 is performed on the respective data series 42 and 43, and data writing in the first bit cell 10T for differential amplification of stored data is sequentially performed. STEPS 1 through 3 may be performed in any order.

Subsequently, in writing data "0" in a bit cell after STEPS 1 through 3, data "1" is written in the second bit cell 110B in the following manner.

First, the input signal 17 for controlling the bit-cell selector 14 is set at "L" and the input signal 18 is set at "H". Then, the bit-cell selector 14 turns OFF all the first switching transistors 15T(0) through 15(n−1) for controlling writing of data in the first bit cells 10T(0) through 10T(n−1) (sets the gate potentials at "L") so that none of the first bit cells 10T(0) through 10T(n−1) is selected for writing.

Then, data "1" is input to the data line 19(1) out of the data lines 19(0) through 19(n−1) connected to the first bit cells 10T(0) through 10T(n−1) and the second bit cells 10B(0) through 10B(n−1) whereas data "0" is input to the other data lines. At this time, only the second switching transistor 15B(1) for controlling writing of data in the second bit cell 10B(1) connected to the data line 19(1) through the bit-cell selector 14 is turned OFF whereas the other second switching transistors 15B(0) through 15B(n−1) (where n=1, 3, 4, . . . ) are turned ON. In the data series 44 shown in FIG. 3, 2m bits to be input to each of the data lines 19(0) through 19(n−1) are set at "H". This state corresponds to the state immediately before the potentials at the control gate (the gate line 12) and the source line 13 rise in WRITE "0" (operation of writing "0") shown in FIG. 4.

In this state, a high voltage is applied to the gate line 12 and the source line 13 as shown in FIG. 4. Then, current flows only in the second bit cells 10B(0) through 10B(n−1) (where n=1, 3, 4, . . . ), and channel hot electrons are generated so that charge reaches the floating gates of the nonvolatile cell transistors. Accumulation of charge increases the threshold voltages of the nonvolatile cell transistors, and logic data "1" is stored. At this step, no current is generated and no write operation is performed in the bit cells except for the bit cells 10B(0) through 10B(n−1) (where n=1, 3, 4, . . . ).

In STEPS 5 and 6, processes similar to that in STEP 4 are performed with data to be written shifted to the data series 45 and 46 this order. The final write operation completes when data writing for differential amplification of stored data is sequentially performed on all the second bit cells 10B(0) through 10B(n−1).

On the other hand, in reading data stored in a bit cell, the third and fourth switching transistors 16T and 16B are turned ON and the first and second switching transistors 15T and 15B are turned OFF so that electric fields are generated in the bit cells 10T and 10B. Then, the amount of current flowing in a bit cell including charge e$^-$ differs from that in a bit cell not including charge e$^-$. The differential amplifier 11 connected to the selected first and second bit cells 10T and 10B is enabled according to a control signal 20 to detect the current difference and amplify the voltage difference between the first and second bit cells, thereby reading data.

As described above, in the semiconductor memory device of this embodiment, all the bit cells incorporated are divided into groups, and data to be input is sequentially shifted and input to data lines connected to the respective bit cell groups. Accordingly, in the semiconductor memory device of this embodiment, the amount of current flowing in a chip during data writing is smaller than that in a conventional semiconductor memory device including differential cells, so that write operation is performed within the current ability of a writing device.

In addition, in the semiconductor memory device of this embodiment, data is written in a bit cell for storing data "1" and a bit cell for storing data "0" separately, and all the data except for m fixed-length bits is set at "L" in writing data "1" and is set at "H" in writing data "0". Accordingly, in the semiconductor memory device of this embodiment, prevention of the flow of current exceeding the current ability of a writing device is ensured during write operation, so that writing of data in all the bit cells incorporated in the device is further ensured as compared to a conventional semiconductor device.

A semiconductor memory device according to the present invention is not limited to the configuration described in this embodiment. The bit-cell selector 14 may have a configuration other than that illustrated in FIG. 1.

In the foregoing example, in data writing, all the bits are divided into three at data input. The bits may be divided into any number of groups.

Embodiment 2

Figure 5:
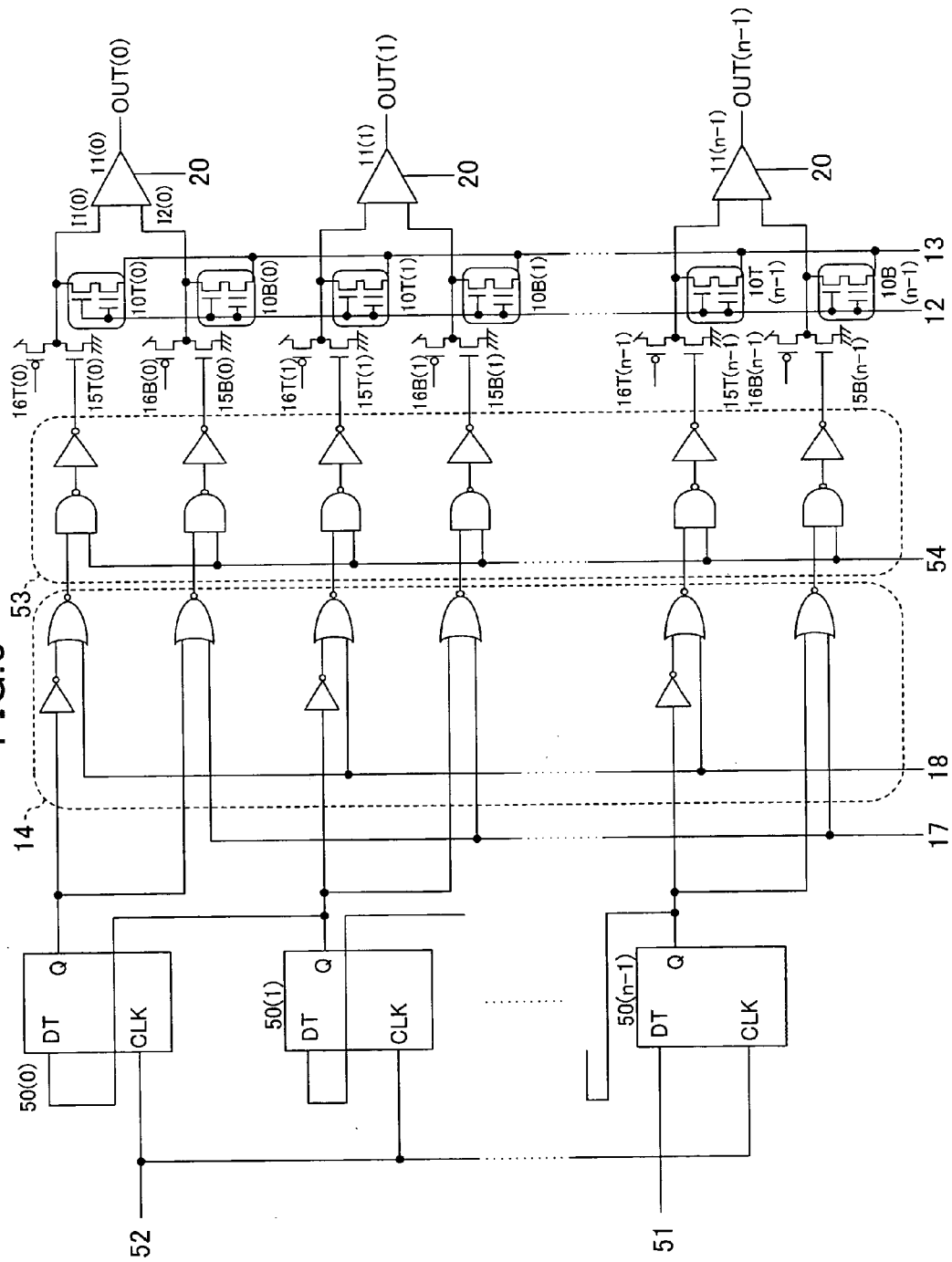
FIG. 5 is a circuit diagram illustrating a configuration of a semiconductor memory device according to a second embodiment of the present invention.
Figure 6:
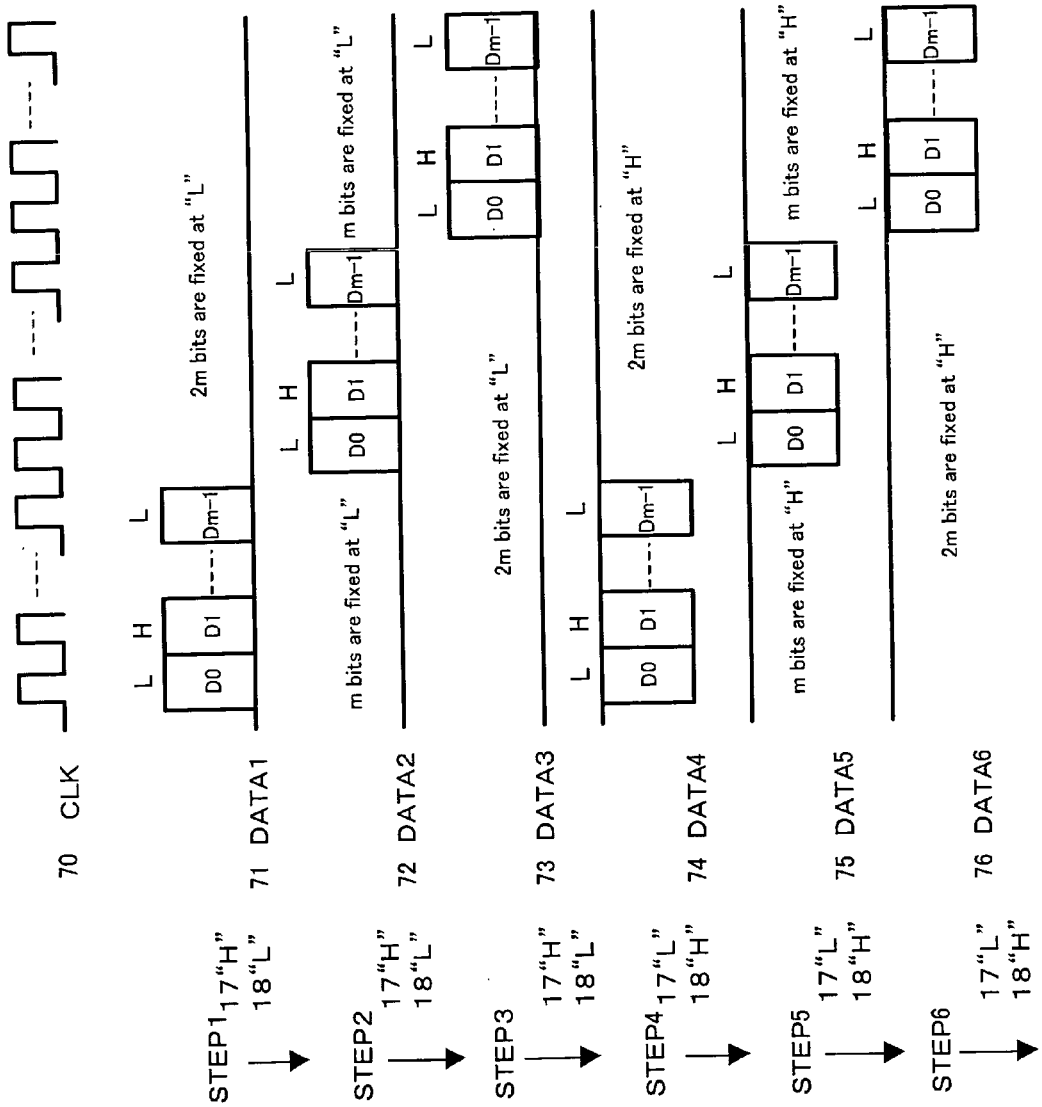
FIG. 6 is a timing chart showing timings of data inputs in the semiconductor memory device of the second embodiment.
Figure 7:
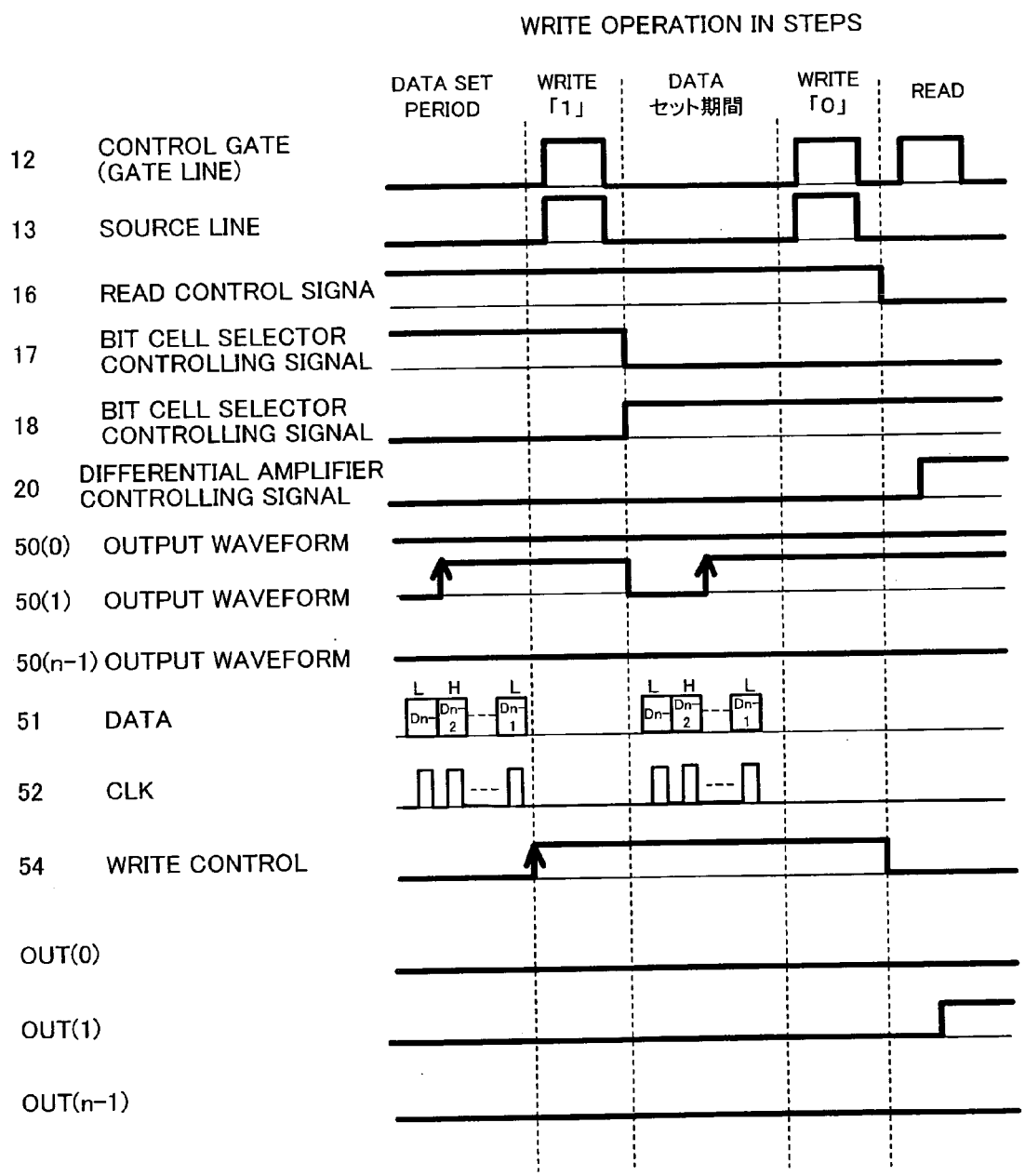
FIG. 7 is a timing diagram in write operation and read operation in the semiconductor memory device of the second embodiment.

FIG. 5 is a diagram illustrating a configuration of a semiconductor memory device according to a second embodiment of the present invention. The components also shown in FIG. 1 are denoted by the same reference numerals. FIG. 6 is a timing diagram showing timings of data inputs in the semiconductor memory device of this embodiment. FIG. 7 is a timing diagram in write operation and read operation in the semiconductor memory device of this embodiment.

As illustrated in FIG. 5, the semiconductor memory device of this embodiment further includes: shift registers 50(0) through 50(n−1) (where n=1, 2, 3, . . . ) provided at a previous stage of a bit-cell selector 14; and a data write controlling circuit 53 receiving an output from the bit-cell selector 14, in addition to the configuration of the semiconductor memory device of the first embodiment.

Each of the shift registers 50(0) through 50(n−1) receives a clock signal 52 and data. The shift registers 50(0) through 50(n−1) are connected in series to form a scan circuit for transferring data input from a data line 51, and output "0" as initial values before circuit operation.

The data write controlling circuit 53 is controlled according to a write control signal 54. Outputs from the data write controlling circuit 53 are input to the respective gate electrodes of first switching transistors 15T(0) through 15T(n−1) and second switching transistors 15B(0) through 15B(n−1).

FIG. 6 shows an example in which data to be input is divided in units of m bits, as an example of division of bits in data input. In the upper portion of FIG. 6, a waveform of a clock signal 70 input to the shift registers 50(0) through 50(n−1) in common is shown.

Data series 71 through 73 contain divided data input to the shift register 50 at STEPS 1 through 3, respectively, for the first bit cell 10T. Data series 74 through 76 contain divided data input to the shift register 50 at STEPS 4 through 6, respectively, for the second bit cell 10B.

In the semiconductor memory device of this embodiment, data to be written is set in the one of the shift registers 50(0) through 50(n−1) associated with a predetermined number of bits (i.e., m fixed-length bits in this case) and data "0" is set in the other shift registers 50(0) through 50(n−1) associated with bits other than the fixed-length bits. The number of bits is predetermined according to the number of inputs of clock signals 70 shown in FIG. 6. At this time, write operation in which the pattern of data to be set has been previously recorded is performed. The fixed-length bits are sequentially shifted so that write operation of all the bits is performed.

Hereinafter, it will be described how the semiconductor memory device operates in a write mode.

In this embodiment, as an example, the number of all bit cells incorporated is n, and data is input in three steps in each of the bit cells. At each step, m bits are written as a unit (n=3 m). In the example shown in FIG. 6, data "1" corresponds to D1 in STEPS 1 through 6.

First, at STEP 1, DATA1 of m bits included in the data series 71 is input to the data line 51. At this step, data except for m bits is "0" (i.e., is set at "L"). In this manner, write operation is performed only on the input DATA1. Hereinafter, circuit operation when DATA1 is written will be described.

First, since write operation is being performed, differential amplifiers 11(0) through 11(n−1) for use in read operation are controlled to be in non-operating states according to control signals 20. Third switching transistors 16T(0) through 16T(n−1) and fourth switching transistors 16B(0) through 16B(n−1) are controlled to be OFF.

Next, a write control signal 54 is set at "L" so that the data write controlling circuit 53 is kept in a disable state until data to be written in a bit cell is set in the scan circuit formed by the shift registers 50(0) through 50(n−1) (where n=1, 2, 3, . . . ). Under this state, input signals 17 and 18 for controlling the bit-cell selector 14 are set at "H" and "L", respectively. Then, the bit-cell selector 14 for selecting one of first bit cells 10T(0) through 10T(n−1) and second bit cells 10B(0) through 10B(n−1) turns OFF all the second switching transistors 15B(0) through 15B(n−1) for controlling writing of data in the second bit cells 10B(0) through 10B(n−1) so that none of the second bit cells 10B(0) through 10B(n−1) is selected for writing.

Thereafter, the scan circuit formed by the serially-connected shift registers 50(0) through 50(n−1) (where n=1, 2, 3, . . . ) makes only output data from the shift register 50(1) "1" and output data from the other shift registers 50(0) through 50(n−1) (where n=1, 3, 4, . . . ) "0". Subsequently, data to be written is set in the scan circuit, and then an "H" signal is input as the write control signal 54 so that the data write controlling circuit 53 is enabled. Then, only the first switching transistor 15T(1) whose gate electrode is connected to the shift register 50(1) through the bit-cell selector 14 and the data write controlling circuit 53 is turned ON and the other first switching transistors 15T(0) through 15T(n−1) (where n=1, 3, 4, . . . ) are turned OFF.

In this state, a high voltage is applied to a gate line 12 and a source line 13, so that WRITE "1" shown in FIG. 7 is performed. As a result, current flows only in the first bit cell 10T(1) and channel hot electrons are generated to cause charge to reach the floating gate. Accumulation of charge increases the threshold voltage of the nonvolatile cell transistor, and logic data "1" is stored. At this time, no current is generated and no write operation is performed in the bit cells except for the first bit cell 10T(1).

At STEPS 2 and 3 shown in FIG. 6, write operation similar to that in STEP 1 is performed on the data series 72 and 73 in this order, and data is sequentially written in the first bit cells 10T(0) through 10T(n−1) for differential amplification of stored data. After STEPS 1 through 3, in the case of writing data "0" in a bit cell, the following operation is performed.

First, input signals 17 and 18 for controlling the bit-cell selector 14 are set at "L" and "H", respectively. The data series 74 is a data series for use in writing in the second bit cell 10B. The data series 74 is composed of divided data of m bits and fixed data "1" of 2 m bits and is sequentially transferred according to a clock signal 52. Then, the bit-cell selector 14 for selecting one of the first bit cells 10T(0) through 10T(n−1) and the 10B(0) through 10B(n−1) turns OFF all the first switching transistors 15T(0) through 15T(n−1) for controlling writing of data in the first bit cells 10T(0) through 10T(n−1) so that none of the first bit cells 10T(0) through 10T(n−1) is selected for writing.

Thereafter, the scan circuit formed by the serially-connected shift registers 50(0) through 50(n−1) (where n=1, 2, 3, . . . ) makes only output data from the shift register 50(1) "1". Data "1" is transferred to bit cells associated to the other 2 m bits. After data to be written has been set in the scan circuit, an "H" signal is input as a write control signal 54 so that the data write controlling circuit 53 is enabled. Then, only the second switching transistor 15B(1) for controlling writing of data in the second bit cell 10B(1) connected to the shift register 50(1) through the bit-cell selector 14 and the data write controlling circuit 53 is turned OFF. The second switching transistors 15B(0) through 15B(n−1) (where n=1, 3, 4, . . . m) are turned ON and the second switching transistors 15B associated with the other 2 m bits are turned OFF.

In this state, a high voltage is applied to the control gate (the gate line) 12 and the source line 13, so that WRITE "0" shown in FIG. 7 is performed. Accordingly, current does not flow in the second bit cell 10B(1) associated with given m bits in a data series, flows only in the second bit cells 10B(0) through 10B(n−1) (where n=1, 3, 4, . . . , m) and does not flow in the second bit cells 10B associated with the other 2 m bits. As a result, channel hot electrons are generated in the second bit cells 10B(0) through 10B(n−1) (where n=1, 3, 4, . . . , m) and charge reaches the floating gates of the nonvolatile cell transistors. Accumulation of charge increases the threshold voltages, and logic data "1" is stored. In STEPS 5 and 6 shown in FIG. 6 are examples in which processes similar to those for the foregoing steps are performed on the data series 75 and 76 in this order for writing. In this manner, data is sequentially written in the second bit cells 10B for differential amplification, and the final write operation completes.

As described above, in the nonvolatile semiconductor device of this embodiment, all the bit cells incorporated in a chip are divided into an arbitrary number of groups, and data to be input is sequentially shifted. In addition, writing is performed on a bit cell for storing data "1" and a bit cell for storing data "0" separately. In this manner, data is written in all the incorporated bit cells within the current ability of a writing device. Moreover, data is set by using the scan circuit formed by the serially-connected shift registers, so that the number of external terminals is reduced.

The means for selecting bit cells according to the present invention is not limited to that described in this embodiment, and various configurations may be adopted. For example, there may be adopted a configuration in which the first switching transistors 15T(0) through 15T(n−1) and the second switching transistors 15B(0) through 15B(n−1) for controlling writing of data in bit cells are formed by pMOS transistors, the third switching transistors 16T(0) through 16T(n−1) and the fourth switching transistors 16B(0) through 16B(n−1) for controlling reading are formed by nMOS transistors, and an inversion signal of a signal output from the bit-cell selector 14 for selecting one of the first and second bit cells is input to the first switching transistors 15T(0) through 15T(n−1) and the second switching transistors 15B(0) through 15B(n−1).

In addition, the data write controlling circuit 53, for example, may be omitted such that "H" signals are input to the bit-cell selector 14 as input signals 17 and 18 so as to turn OFF the first and second switching transistors 15T and 15B for controlling data writing.

Embodiment 3

Figure 8:
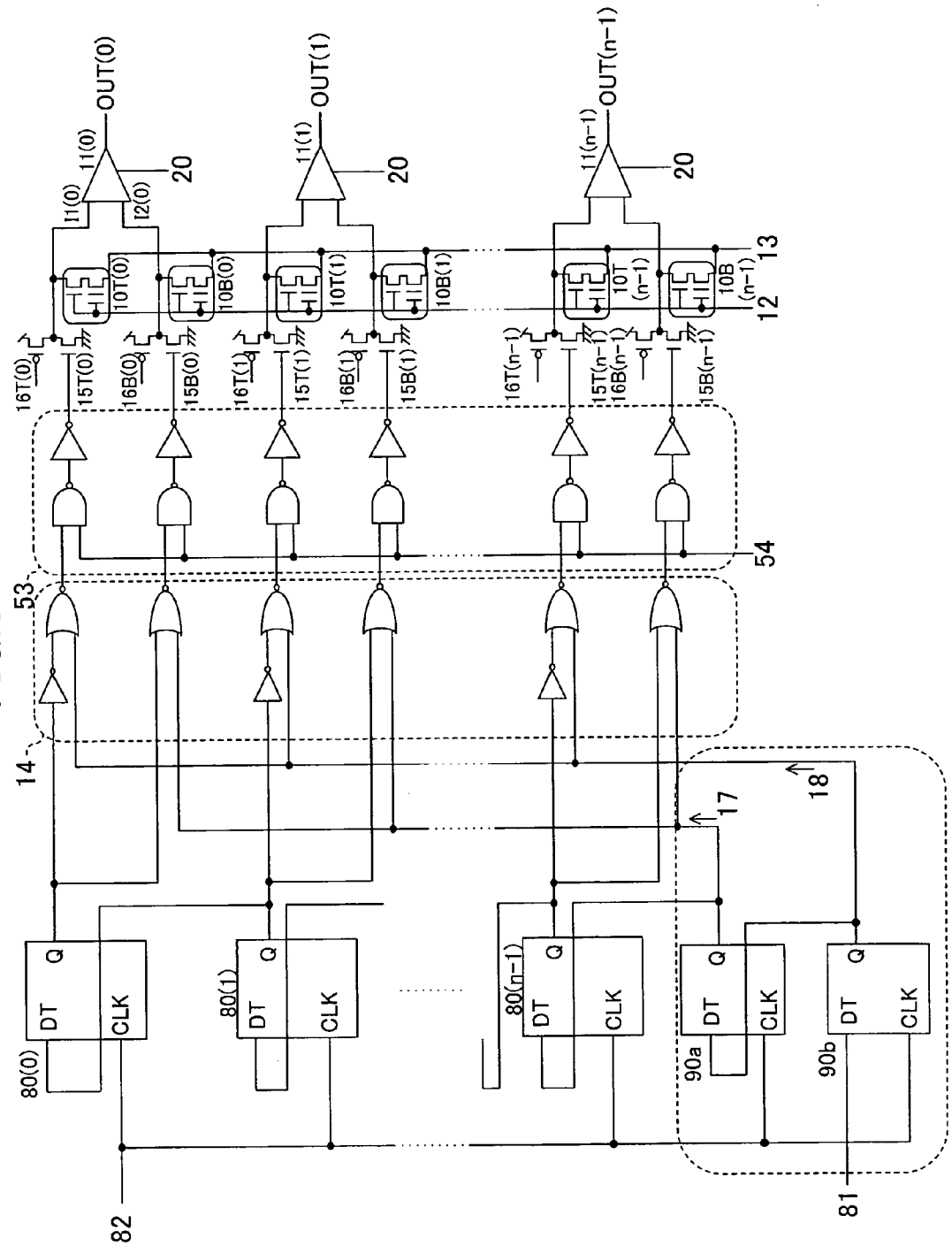
FIG. 8 is a circuit diagram illustrating a configuration of a semiconductor memory device according to a third embodiment of the present invention.
Figure 9:
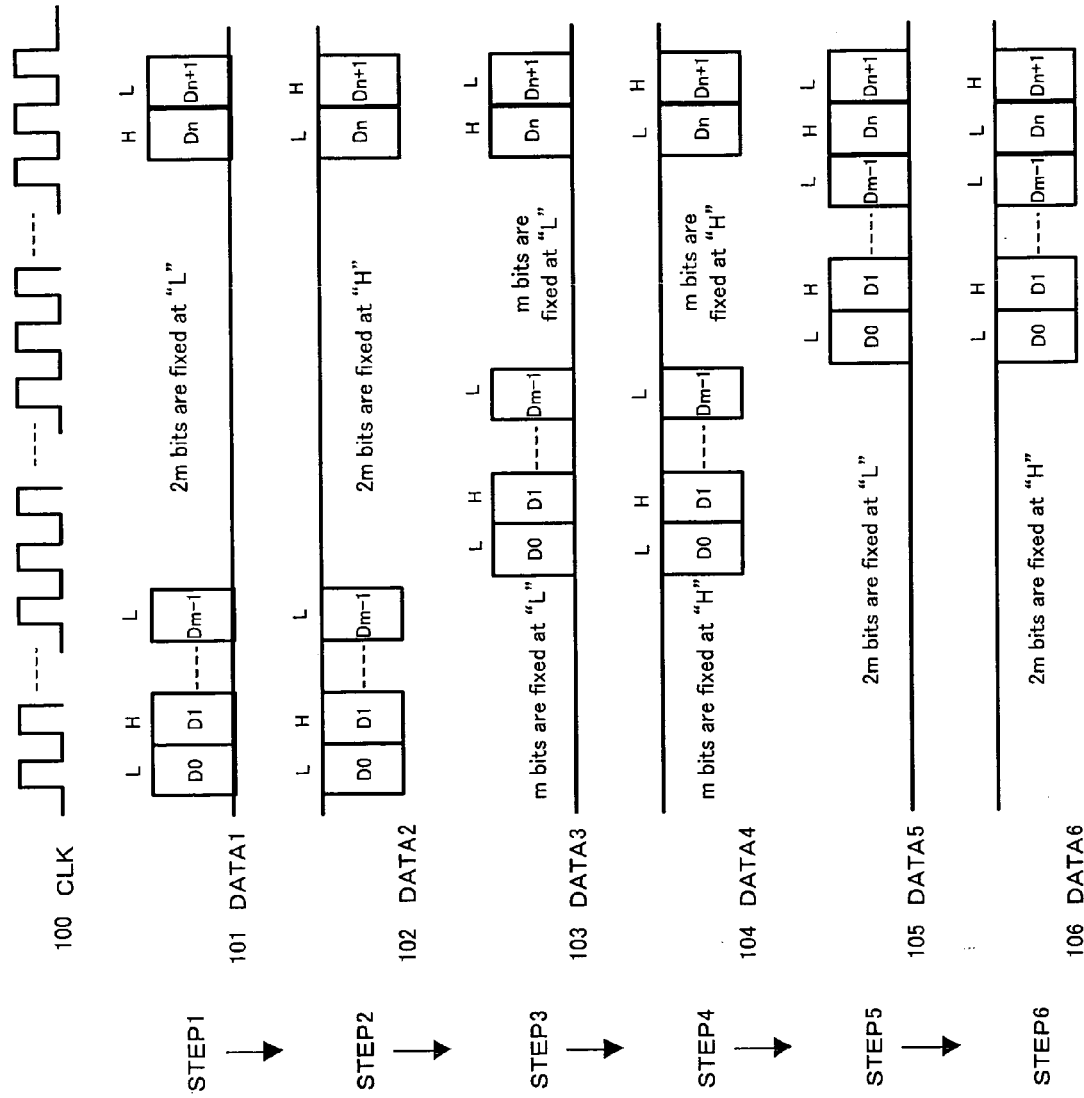
FIG. 9 is a diagram showing sequential data inputs in the semiconductor memory device of the third embodiment.
Figure 10:
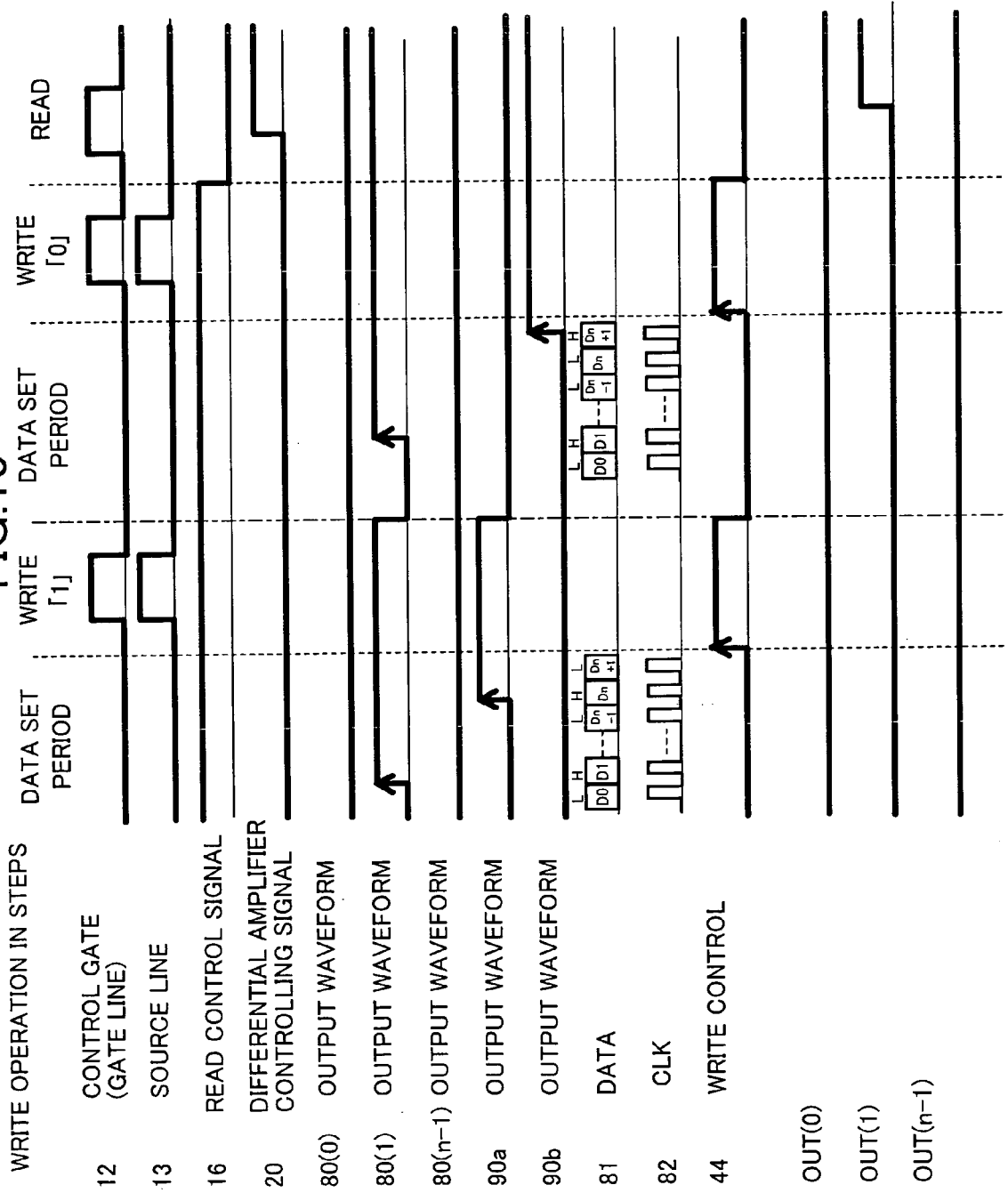
FIG. 10 is a timing diagram in write operation and read operation in the semiconductor memory device of the third embodiment.

FIG. 8 is a circuit diagram illustrating a configuration of a semiconductor memory device according to a third embodiment of the present invention. The components also shown in FIGS. 1 and 5 are denoted by the same reference numerals. FIG. 9 is a timing diagram showing timings of data inputs in the semiconductor memory device of this embodiment. FIG. 10 is a timing diagram in write operation and read operation in the semiconductor memory device of this embodiment.

As illustrated in FIG. 8, the semiconductor memory device of this embodiment further includes two shift registers 90a and 90b provided at a previous stage of a bit-cell selector 14 and connected to serially-connected shift registers 80(0) through 80(n−1) (where n=1, 2, 3, . . . ) in series, in addition to the configuration of the semiconductor memory device of the second embodiment.

The shift registers 80(0) through 80(n−1) are identical to the shift registers 50(0) through 50(n−1) illustrated in FIG. 5, and the shift registers 80(0) through 80(n−1) and the shift registers 90a and 90b form a scan circuit for transferring data through serial connection as a whole. One pair of shift registers 90a and 90b is sufficient for the shift registers 80(0) through 80(n−1) associated with all the bits. An initial output value before operation of the scan circuit composed of the shift registers 80(0) through 80(n−1) and the shift registers 90a and 90b is "0".

The outputs of the shift registers 90a and 90b serve as control signals (i.e., input signals 17 and 18) for allowing the output of the bit-cell selector 14 to select one of the first and second bit cells. Data to be input to the scan circuit is input from the shift register 90b through a data line 81. A clock signal 82 is input to all the shift registers 80(0) through 80(n−1) (where n=1, 2, 3, . . . ) and the shift registers 90a and 90b.

FIG. 9 shows an example in which data is divided in units of m bits in data input. In this example, n bit cells are incorporated, and the n-th data and the (n+1)th data exceeding the number of bit cells are processed as data to be input to the shift registers 90a and 90b, respectively, illustrated in FIG. 8. In FIG. 9, a waveform 100 is a waveform of a clock input to the shift registers 80(0) through 80(n−1), 90a and

90b. A data series 101 is divided data input to the shift registers 80(0) through 80(n−1), 90a and 90b and used in writing "1" in a bit cell at STEP 1. A data series 102 is divided data input to the shift registers 80(0) through 80(n−1), 90a and 90b and used in writing "0" in a bit cell at STEP 2. A data series 103 is divided data input to the shift registers 80(0) through 80(n−1), 90a and 90b and used in writing "1" in a bit cell at STEP 3. A data series 104 is divided data input to the shift registers 80(0) through 80(n−1), 90a and 90b and used in writing "0" in a bit cell at STEP 4. A data series 105 is divided data input to the shift registers 80(0) through 80(n−1), 90a and 90b and used in writing "1" in a bit cell at STEP 5. A data series 106 is divided data input to the shift registers 80(0) through 80(n−1), 90a and 90b and used in writing "0" in a bit cell at STEP 6.

Now, it will be described how the semiconductor memory device of this embodiment operates in a write mode.

In this embodiment, as an example, all the bits used in this device are 3 m bits (n=3m) and data of all the bits is divided i cell associated with D1 shown in FIG. 9 at each step.

First, at STEP 1, a data series 101 including DATA1 is input to the shift registers 80(0) through 80(n−1), 90a and 90b. At this time, this example is characterized in that 2 m bits, i.e., data other than m bits to be input, are "0". In this manner, write operation is performed only for DATA1 in the input data series 101. Hereinafter, circuit operation when DATA1 is written will be described.

First, since write operation is being performed, differential amplifiers 11(0) through 11(n−1) for use in read operation are controlled to be in non-operating states according to control signals 20.

Next, a write control signal 54 is set at "L" so that a data write controlling circuit 53 is disabled.

Then, data is set in the scan circuit such that data output from the shift register 90a is "1", data output from the shift register 90b is "0" and an output from the shift register 80(1) is "1".

Thereafter, after data has been set in the shift registers 80(0) through 80(n−1), 90a and 90b, a write control signal 54 is set at "H" so that the data write controlling circuit 53 is enabled. Then, the bit-cell selector 14 turns OFF all the second switching transistors 15B(0) through 15B(n−1) for controlling writing of data in the second bit cells 10B(0) through 10B(n−1) according to data (input signals 17 and 18) output from the shift registers 90a and 90b. Accordingly, none of the second bit cells 10B(0) through 10B(n−1) is selected for writing. Only a first switching transistor 15T(1) for controlling writing of data in a first bit cell 10T(1) to which data is transmitted from the shift register 80(1) through the bit-cell selector 14 and the data write controlling circuit 53 is turned ON, and the other first switching transistors 15T(0) through 15T(n−1) (where n=1, 3, 4, ... ) are turned OFF. That is, none of the first bit cells 10T(0) through 10T(n−1) (where n=1, 3, 4, ... ) except for the first bit cell 10T(1) to which data is written is selected for writing.

In this state, a high voltage is applied to a gate line 12 and a source line 13, so that WRITE "1" shown in FIG. 10 is performed. As a result, current flows only in the first bit cell 10T(1) and channel hot electrons are generated to cause charge to reach the floating gate. Accumulation of charge increases the threshold voltage of the nonvolatile cell transistor, and logic data "1" is stored. At this time, no current is generated and no write operation is performed in the bit cells except for the first bit cell 10T(1).

The driving method shown in FIG. 9 is different from that shown in FIG. 6 in that m bits used in STEP 1 are written in the second bit cell 10B(1) at STEP 2. At STEPS 3 and 4, next m bits are written in the first and second bit cells 10T and 10B, respectively. At STEPS 5 and 6, next m bits are written in the first and second bit cells 10T and 10B, respectively. STEPS 1 through 6 may be performed in any order.

After STEP 1, in the case of writing data "0" in a bit cell at STEP 2, the following operation is performed.

First, a write control signal 54 is set at "L" so that the data write controlling circuit 53 is disabled. The scan circuit is set such that data "0" is set in the shift register 90a, data "1" is set in the shift register 90b, and data "0" is output as data to be written in bit cells at a time from the shift registers 80(0) through 80(n−1) (where n=1, 3, 4, ... ).

Next, after data has been set in the scan circuit, a write control signal 54 is set at "H" so that the data write controlling circuit 53 is enabled. At this time, only the second switching transistors 15B(0) through 15B(n−1) (where n=1, 3, 4, ... ) for controlling writing of data in the second bit cells 10B(0) through 10B(n−1) (where n=1, 3, 4, ... ) to which data set in the shift registers 80(0) through 80(n−1) is transmitted through the bit-cell selector 14 and the data write controlling circuit 53 are turned ON.

In this state, a high voltage is applied to the gate line 12 and the source line 13. Accordingly, current flows in the second bit cells 10B(0) through 10B(n−1) (where n=1, 3, 4, ... ) and channel hot electrons are generated to cause charge to reach the floating gates. Accumulation of charge increases the threshold voltages, and logic data "1" is stored. At this time, no current is generated and no write operation is performed in the bit cells except for the second bit cells 10B(0) through 10B(n−1) (where n=1, 3, 4, ... ).

Subsequently, in STEPS 3 through 6, write operation similar to that in STEPS 1 and 2 is performed on divided m bits.

With respect to read operation, operation similar to that in the first embodiment is performed.

As described above, in the method for driving the semiconductor memory device of this embodiment, all the bit cells incorporated are divided, data to be input is shifted, and writing is performed on a bit cell for storing data "1" and on a bit cell for storing data "0" separately. This prevents current exceeding the current ability of a writing device from flowing in a chip. Accordingly, writing of data in all the bit cells is ensured. In addition, in the semiconductor memory device of this embodiment, data is set using the scan circuit in which shift registers are connected in series and a control signal for the bit-cell selector 14 is output from the shift registers 90a and 90b as part of the scan circuit, so that the number of external terminals can be further reduced, as compared to the second embodiment. Accordingly, the semiconductor memory device of this embodiment is effective in size reduction of system LSI incorporating this device. In such a case, the semiconductor memory device of this embodiment can be used as a substitute for a fuse, for example.

The selecting means according to the present invention is not limited to that used in this embodiment, and various configurations may be adopted. For example, there may be adopted a configuration in which the first switching transistors 15T(0) through 15T(n−1) and the second switching transistors 15B(0) through 15B(n−1) for controlling writing of data in bit cells are formed by pMOS transistors, the third switching transistors 16T(0) through 16T(n−1) and the fourth switching transistors 16B(0) through 16B(n−1) for controlling reading are formed by nMOS transistors, and an inversion signal of a signal output from the bit-cell selector 14 for selecting one of the first and second bit cells is input to the first switching transistors 15T(0) through 15T(n−1) and the second switching transistors 15B(0) through 15B(n−1).

Embodiment 4

Figure 11:
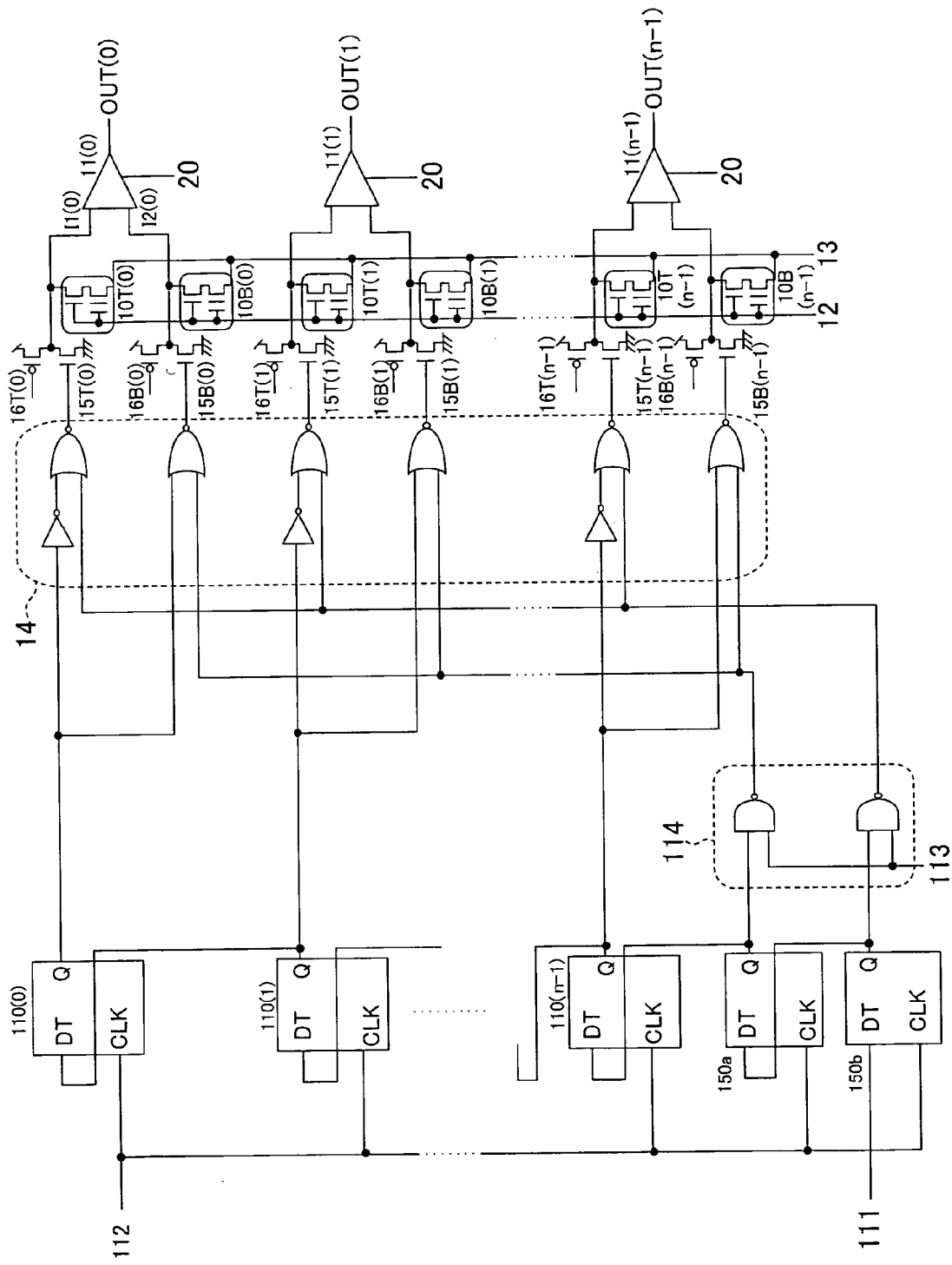
FIG. 11 is a circuit diagram illustrating a configuration of a semiconductor memory device according to a fourth embodiment of the present invention.

FIG. 11 is a circuit diagram illustrating a configuration of a semiconductor memory device according to a fourth embodiment of the present invention. The components also shown in FIG. 1 are denoted by the same reference numerals. FIG. 12 is a timing diagram showing timings of data inputs. FIG. 13 is a timing diagram in normal write operation and read operation in the semiconductor memory device of this embodiment.

As illustrated in FIG. 11, the semiconductor memory device of this embodiment further includes: shift registers 110(0) through 110(n−1) (where n=1, 2, 3, . . . ) connected in series; two shift registers 150a and 150b connected to the shift registers 110(0) through 110(n−1) in series; and a write control circuit 114 provided between output parts of the shift registers 150a and 150b and a bit-cell selector 14, in addition to the configuration of the semiconductor memory device of the first embodiment. The shift registers 110(0) through 110(n−1), the shift registers 150a and 150b and the write control circuit 114 are provided at previous stages of the bit-cell selector 14. The shift registers 110(0) through 110(n−1), 150a and 150b are identical to the shift registers 80(0) through 80(n−1), 90a and 90b of the semiconductor memory device of the third embodiment. One pair of shift registers 150a and 150b is provided for all the bit cells incorporated in a chip. Data input through a data line 111 is transferred to the shift registers 110(0) through 110(n−1), 150a and 150b connected in series and forming a scan circuit. The initial output values of these shift registers before operation are "0". A clock signal 112 is input to the shift registers 110(0) through 110(n−1), 150a and 150b.

The write control circuit 114 is formed by a first NAND circuit receiving an output from the shift register 150a and a second NAND circuit receiving an output from the shift register 150b, and enables or disables the bit-cell selector 14 using the logic of a write control signal 113 input to input portions of both of the first and second NAND circuits. In the semiconductor memory device of this embodiment, as shown in FIG. 12, for example, data of m bits (n=3 m), which is one third of all the bits, is input at a time. In the example shown in this drawing, n bit cells are incorporated, and n-th data and (n+1)th data exceeding the number of incorporated bit cells are used as data to be input to the respective shift registers 150a and 150b illustrated in FIG. 8.

In FIG. 12, a waveform 130 is a waveform of a clock input to the shift registers, a data series 131 is divided data input to a shift register and used in writing "1" in a bit cell at STEP 1, a data series 132 is divided data input to a shift register and used in writing "0" in a bit cell at STEP 2, a data series 133 is divided data input to a shift register and used in writing "1" in a bit cell at STEP 3, a data series 134 is divided data input to a shift register and used in writing "0" in a bit cell at STEP 4, a data series 135 is divided data input to a shift register and used in writing "1" in a bit cell at STEP 5, and a data series 136 is divided data input to a shift register and used in writing "0" in a bit cell at STEP 6.

Now, it will be described how the semiconductor memory device of this embodiment operates in a write mode.

In the following example, all the bits to be used are 3 m bits (n=3 m) and data is divided into three with respect to all the bits. At each step, m bits are written as a unit. At each of the following steps, "1" is written in a bit cell associated with D1 shown in FIG. 12.

First, at STEP 1, the data series 131 including DATA1 is input to the shift registers 110(0) through 110(n−1), 150a and 150b. The driving method of this embodiment is characterized in that data of 2 m bits, i.e., data except for m bits to be input, are "0". In this manner, only DATA1 in the input data series 131 is written. Hereinafter, circuit operation when DATA1 is written will be described.

Since write operation is being performed, differential amplifiers 11(0) through 11(n−1) for use in read operation are controlled to be in non-operating states according to control signals 20. Third switching transistors 16T(0) through 16T(n−1) and fourth switching transistors 16B(0) through 16B(n−1) are controlled to be OFF.

Then, a write control signal 113 is set at "L" so that the write control circuit 114 is disabled. In this manner, first switching transistors 15T(0) through 15T(n−1) (where n=1, 2, 3, . . . ) and second switching transistors 15B(0) through 15B(n−1) (where n=1, 2, 3, are turned OFF.

Thereafter, the scan circuit formed by the shift registers 110(0) through 110(n−1) (where n=1, 2, 3, . . . ) connected in series is set such that only data output from the shift register 110(1) is "1". At this time, the shift registers 110(0) through 110(n−1) (where n=1, 3, 4, . . . ) and the shift register 150a output data "0" and the shift register 150b outputs data "1".

Subsequently, after data to be written has been set in the scan circuit, a write control signal 113 is set at "H" so that the write control circuit 114 is enabled. At this time, the second switching transistors 15B(0) through 15B(n−1) for controlling writing of data in the second bit cells 10B(0) through 10B(n−1) are OFF. The first switching transistor 15T(1) for controlling writing of data in the first bit cell 10T(1) to which data is transmitted from the shift register 110(1) through the bit-cell selector 14 is turned ON. On the other hand, the second switching transistor 15B(1) is turned OFF. At the same time, since the shift registers 110(0) through 110(n−1) except for the shift register 110(1) output data "0", so that the first switching transistors 15T(0) through 15T(n−1) (where n=1, 3, 4, . . . ) are turned OFF.

In this state, a high voltage is applied to a gate line 12 and a source line 13 so that WRITE "1" shown in FIG. 13 is performed. As a result, current flows only in the first bit cell 10T(1), and channel hot electrons are generated so that charge reaches the floating gate. Accumulation of charge increases the threshold voltage of the nonvolatile cell transistor, and logic data "1" is stored. At this step, no current is generated and no write operation is performed in the bit cells except for the first bit cell 10T(1).

Then, the process proceeds to STEP 2. In the case of writing data "0" in a bit cell, a write control signal 113 is set at "L" first so that the write control circuit 114 is disabled. In this manner, the first switching transistors 15T(0) through 15T(n−1) (where n=1, 2, 3, . . . ) and the second switching transistors 15B(0) through 15B(n−1) (where n=1, 2, 3, . . . ) are turned OFF.

Thereafter, the scan circuit formed by the serially-connected shift registers 110(0) through 110(n−1) (where n=1, 2, 3, . . . ) is set such that data output from the shift registers 110(0) through 110(n−1) (where n=1, 3, 4, . . . ) is "0". In addition, the scan circuit is also set such that the output of the shift register 150a is "1" and the output of the shift register 150b is "0".

Subsequently, after data to be written has been set in the scan circuit, an "H" signal is input as a write control signal 113 so that the write control circuit 114 is enabled. At this time, the first switching transistors 15T(0) through 15T(n−1) for controlling writing of data in the first bit cells 10T(0) through 10T(n−1) are turned OFF. The second switching transistor 15B(1) for controlling writing of data in the second bit cell 10B(1) to which data is transmitted from the shift registers 110(0) through 110(n−1) (where n=1, 3, 4, . . . ) through the bit-cell selector 14 is turned OFF. On the other hand, the second switching transistors 15B(0) through 15B(n−1) (where n=1, 3, 4 . . . ) are turned ON.

In this state, a high voltage is applied to the gate line 12 and the source line 13. As a result, current flows in the second bit cells 10B(0) through 10B(n−1) (where n=1, 3, 4, . . . ), and channel hot electrons are generated so that charge reaches the floating gates. Accumulation of charge increases the threshold voltages, and logic data "1" is stored.

On the other hand, no current flows in the first bit cells 10T(0) through 10T(n−1) (where n=1, 2, 3, . . . ) and the second bit cell 10B(1), and no channel hot electrons are generated therein. Accordingly, charge is not accumulated in the floating gates, so that the threshold voltages of the nonvolatile cell transistors are kept low, and logic data "0" is stored.

Write operation is similar to normal operation described in the first embodiment, and the description thereof will be omitted.

As described above, in the semiconductor memory device of this embodiment, all the bit cells incorporated are divided, data to be input is sequentially shifted, and writing is performed on a bit cell for storing data "1" and a bit cell for storing data "0" separately. In this manner, data is written in all the bit cells within the current ability of a writing device. In addition, data to be written is set in the scan circuit in which the shift registers 110(0) through 110(n−1) are connected in series, and the write control circuit 114 is implemented by using the outputs of the shift registers 150a and 150b and the logic of the write control signal 113. Accordingly, it is unnecessary to prepare a writing control circuit for each of the first and second bit cells, so that incorporated circuits are simplified and the circuit area is reduced.

The circuit configuration of a semiconductor memory device according to the present invention is not limited to that described in this embodiment. For example, there may be adopted a configuration in which the first switching transistors 15T(0) through 15T(n−1) and the second switching transistors 15B(0) through 15B(n−1) for controlling writing of data in bit cells are formed by pMOS transistors, the third switching transistors 16T(0) through 16T(n−1) and the fourth switching transistors 16B(0) through 16B(n−1) for controlling reading are formed by nMOS transistors, and an inversion signal of a signal output from the bit-cell selector 14 for selecting one of the first and second bit cells is input to the first switching transistor 15T(0) through 15T(n−1) and the second switching transistors 15B(0) through 15B(n−1).

In the foregoing embodiments, nonvolatile bit cells with stacked gate structures have a common floating gate for accumulating charge, as an example. However, nonvolatile bit cells used in the embodiments of the present invention are not limited to this structure. For example, even in a case where two MOS transistors of a one-layer polysilicon type whose gate electrodes are connected to each other are used as a nonvolatile bit cell, the semiconductor memory devices of the embodiments are also implemented.

A nonvolatile semiconductor memory device according to the present invention as described above can be used as a substitute for a fuse in system LSI, in addition to the use as a memory device.

What is claimed is:

1. A nonvolatile semiconductor memory device, comprising:
   a plurality of pairs of first and second bit cells for storing data;
   a plurality of differential amplifiers each receiving, as complementary inputs, information from an associated one of the first bit cells and information from an associated one of the second bit cells and amplifying a difference between the inputs; and
   a bit-cell selector receiving the data and controlled to select one of the first and second bit cells according to an input signal.

2. The nonvolatile semiconductor memory device of claim 1, wherein in the selection of one of the first and second bit cells by the bit-cell selector, whether the data is written in the selected bit cell or not is determined according to the value of the data input to the bit-cell selector.

3. The nonvolatile semiconductor memory device of claim 1, further comprising a write controlling MOS transistor having a gate electrode to which an output from the bit-cell selector is input,
   wherein each of the first and second bit cells includes a nonvolatile cell transistor having a floating gate, and
   in write operation, the data is written by turning the write controlling MOS transistor ON so as to inject electrons in the floating gate.

4. The nonvolatile semiconductor memory device of claim 1, wherein the nonvolatile semiconductor memory device further comprises a plurality of first shift registers connected in series and used for inputting the data to the bit-cell selector.

5. The nonvolatile semiconductor memory device of claim 4, further comprising a data write controlling circuit receiving an output from the bit-cell selector and enabling and disabling writing of the data according to a first control signal.

6. The nonvolatile semiconductor memory device of claim 5, further comprising a second shift register connected to the first shift registers in series and outputting the input signal for controlling the bit-cell selector.

7. The nonvolatile semiconductor memory device of claim 4, further comprising:
   a third shift register connected to the first shift registers in series and outputting the input signal for controlling the bit-cell selector; and
   a write controlling circuit receiving an output from the third shift register and enabling and disabling writing of the data according to a second control signal.

8. The nonvolatile semiconductor memory device of claim 1, wherein each of the first and second bit cells includes two MOS transistors of a one-layer polysilicon type having respective gate electrodes connected to each other.

9. A method for fabricating a nonvolatile semiconductor memory device including a plurality of pairs of first and second bit cells for storing data, differential amplifiers each receiving, as complementary inputs, information from an associated one of the first bit cells and information from an associated one of the second bit cells and amplifying a difference between the inputs, a bit-cell selector receiving the data and controlled to select one of the first and second bit cells according to an input signal, and a plurality of shift registers connected in series, associated with the respective pairs of first and second bit cells and used for inputting the data to the bit-cell selector, the method comprising the steps of:

setting data to be written for one of the first and second bit cells associated with a bit having a fixed length predetermined according to the number of inputs of clock signals for controlling the shift registers, and setting data having a fixed value for the other bit cells associated with bits other than the fixed-length bit, thereby writing the data to be written in said one of the first and second bit cells; and shifting the fixed-length bit to a next fixed-length bit and writing the data to be written in another bit cell associated with the next fixed-length bit.

* * * * *